United States Patent [19]

Birkle et al.

[11] 4,395,481
[45] Jul. 26, 1983

[54] METHOD FOR THE MANUFACTURE OF RESIST STRUCTURES

[75] Inventors: Siegfried Birkle, Höchstadt; Roland Rubner, Röttenbach; Hans Hauschildt, Erlangen; Eva-Maria Rissel, Forchheim, all of Fed. Rep. of Germany

[73] Assignee: Siemens Aktiengesellschaft, Munich, Fed. Rep. of Germany

[21] Appl. No.: 305,798

[22] Filed: Sep. 25, 1981

[30] Foreign Application Priority Data

Sep. 29, 1980 [DE] Fed. Rep. of Germany ....... 3036615

[51] Int. Cl.³ ............................................. G03C 5/00
[52] U.S. Cl. ........................................ 430/326; 430/5
[58] Field of Search ............... 430/326, 313, 314, 315, 430/296, 5, 306, 908, 285

[56] References Cited

U.S. PATENT DOCUMENTS

| | | | |
|---|---|---|---|
| 4,011,351 | 3/1977 | Gipstein et al. | 430/296 |
| 4,268,607 | 5/1981 | Tada | 430/296 |
| 4,273,856 | 6/1981 | Yoneda et al. | 430/326 |

FOREIGN PATENT DOCUMENTS

| | | | |
|---|---|---|---|
| 54-41207 | 12/1979 | Japan | 430/326 |
| 55-140836 | 11/1980 | Japan | 430/326 |

*Primary Examiner*—Won H. Louie, Jr.
*Attorney, Agent, or Firm*—Kenyon & Kenyon

[57] ABSTRACT

The invention relates to a method for the manufacture of positive resist structures by means of short-wave UV rays and has the objective to develop such a method in a manner such that increased sensitivity and resolution as well as high thermal stability and, in addition, transparency in the wave-length range above 260 nm can be achieved. According to the invention, it is provided for this purpose to use as the resist material copolymers of 1 to 70 mol % alkylmethacrylate with an alkyl radical having 1 to 4 C atoms, and 99 to 30 mol % of an ethylenically unsaturated monomer with chlorine and/or cyan substituents. The method according to the invention is particularly well suited for producing resist structures about 0.5 to 2 μm thick by means of UV rays in the wave-length range between about 180 to 260 nm.

3 Claims, 1 Drawing Figure

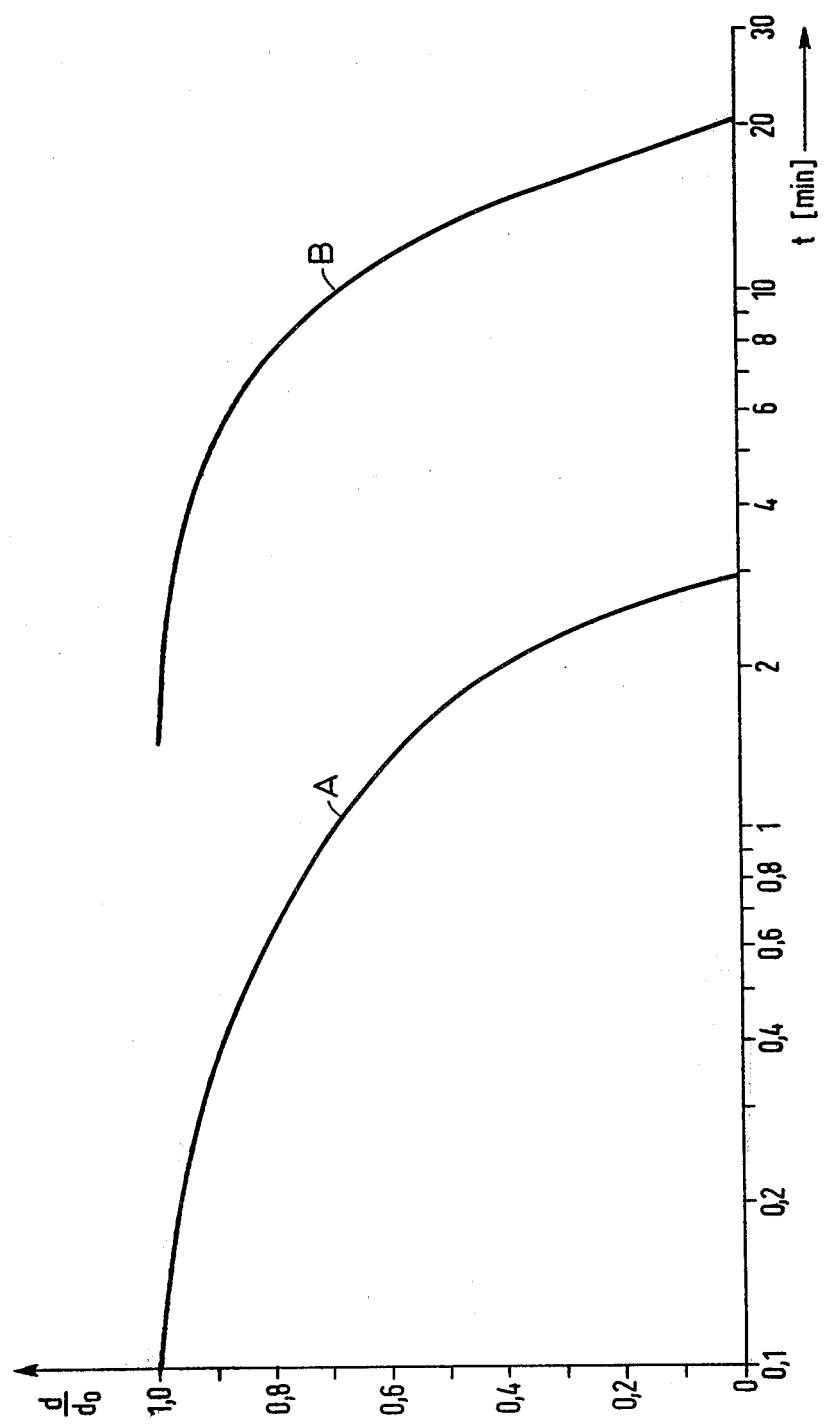

METHOD FOR THE MANUFACTURE OF RESIST STRUCTURES

BACKGROUND OF THE INVENTION

The present invention relates to a method for the manufacture of resist structures of the positive resist type by means of short-wave UV rays.

The manufacture of positive resist structures by means of short-wave UV radiation (deep UV rays) is known, the range of between about 180 and 260 nm being used with preference. The resist structures or masks produced, which preferably have a thickness of about 1 μm, are used especially in the fabrication of integrated circuits.

For manufacturing resist structures of the type mentioned, a number of resist materials is already being used. One of these materials is polymethylmethacrylate (PMMA). This resist material is distinguished by high contrast and is sufficiently thermostable for use in such thermal processes in semiconductor technology in which temperatures above 135° C. are not exceeded. If commercially available short-wave UV lamps such as mercury low pressure lamps, xenon-mercury high pressure lamps or deuterium lamps are used, however, PMMA is too insensitive, i.e., excessively long exposure times are required for forming resist patterns. In the manufacture of integrated circuits by irradiation, it is extremely important to hold as low as possible the energy dose and the exposure time required for sufficient breaking down of polymer material so that the process can be carried out practically as well as economically within justifiable limits.

Polybutene sulfone (PBS), while about 100-times more sensitive to UV rays at 184 nm than PMMA, is not suitable for the thermal processes being practiced in semiconductor technology, such as "lift-off" processes, dry etching processes and ion implantation, because of the low dimensional heat stability and the thermal instability (depolymerization at temperatures of about 70° C.). A further disadvantage of the positive resist PBS is the excessively high absorptivity for short-wave UV rays, which leads to very limited resolution, such that the resist masks of 1 μm thickness, frequently required for structuring processes, can no longer be realized for transferring very small structures onto semiconductor substrates.

Other resist materials such as poly-2,2,3,4,4,4-hexafluorobutylmethacrylate and polymethylisopropenyl ketone, while about 5 to 6 times more sensitive than PMMA and therefore suitable for structuring resist films 1 μm thick, have a dimensional heat stability (glass or glass transition temperature $T_g \sim 50°$ C. and 62° C., respectively) which is likewise so low, however, that they are not suited for thermal processes such as occur in semiconductor technology.

It already has been attempted to use a commercially available photographic varnish of the novolaks and diazoquinones type as the deep-UV resist because of the excellent etching resistance and thermal stability. A particular disadvantage of such a material, however, is an extremely high UV absorption in the application range of interest below 260 nm, so that only varnish films less than 0.5 μm thick can be structured with relatively steep flanks. Films of such thickness, however, have only very limited etching resistance. A further disadvantage is the high spectral sensitivity of the varnish above 300 nm, i.e., high resolution can be achieved only through the use of either interference filters which are expensive and heavily reduce the intensity, or appropriately surface-coated reflection mirrors.

It also has been attempted to sensitize PMMA, while retaining its other good resist properties, to thereby increase the sensitivity about 5 times. The sensitizers are liquid benzoic acid derivatives which absorb in the typical emission range of, for example, a xenon-mercury short-arc lamp, and pass the energy to the PMMA, and thereby cause more chain breaks. However, if a polymethylmethacrylate sensitized in this manner is used, adverse effects on the resist properties can result with consequent limitations of the applications. In particular, if multiply-structured substrates with a height profile are varnished by means of the centrifuging technique, the structure corners receive less varnish than the remainder of the substrate surface. The danger exists, therefore, that in the centrifuging process and in the so-called "prebake", the liquid sensitizer evaporates faster at the less varnished stages and, therefore, different sensitivity regions are formed on the substrate, which can have a substantial adverse effect on the resolution. A similar disadvantageous effect on the quality of the structure can be caused by the liquid or highly volatile additives during the so-called "post-bake". In the case of thicker varnish layers, there is furthermore the danger that so-called "pinholes" are formed during the evaporation of the sensitizer.

In the efficient manufacture of positive resist structures, preferably about 1 μm thick, by means of short-wave UV rays, the following requirements should be met:
  a low UV dose should be required for structuring;
  the structure should have steep resist flanks;
  the resist structure should be chemically resistant to wet etching processes used in semiconductor technology, and thermally resistant in dry etching and "lift off" processes;
  high resolution should be ensured by utilizing the UV spectral range below 260 nm and by the particular spectral absorptivity of the resist material;
  through making the resist transparent above 260 nm, the expensive and intensity-reducing interference filters or appropriately surface-coated reflection mirrors otherwise required for eliminating the longer-wave UV lamp emission region should be dispensed with.

As pointed out above, these requirements in their totality heretofore have been met only unsatisfactorily, since only part of the mentioned requirements can be achieved at any one time with the resist materials used to date.

SUMMARY OF THE INVENTION

It is an object of the present invention to describe a method for the manufacture of positive resist structures by means of short-wave UV rays, in which the above-mentioned requirements are met. In particular, the resist material should have increased sensitivity and resolution in the wavelength range between about 180 and 260 nm, also in layer thicknesses of more than 0.5 nm, as well as high thermal stability, and the resist material should furthermore be completely transparent in the wavelength region above 260 nm.

According to the present invention, this and other objects are achieved by the provision that the resist material comprises a copolymer of:
(a) 1 to 70 mol % alkylmethacrylate with an alkyl radical having 1 to 4 C atoms; and
(b) 99 to 30 mol % of an ethylenically unsaturated monomer with chlorine and/or cyan substituents.

The resist material used in the method according to the present invention meets the specified requirements to a high degree. Due to its increased thermal stability, the resist material can be used in semiconductor-technology processes such as dry etching processes and metallization according to the additive method, at which it is subjected to temperatures above 135° C. As compared to PMMA, for example, the resist material used in the method according to the present invention exhibits improved dimensional heat stability and a higher glass temperature ($T_g > 125°$ C.) and the contrast properties are equally good. The sensitivity of the resist material used in the method of the present invention, however, is 7 times higher than that of PMMA. A particularly advantageous effect is shown with this material in the spectral absorptivity which, as compared to PMMA, exists below 220 nm. This better utilizes the short-wave range of commercially available deep-UV lamps. On the other hand, like PMMA, the resist material is transparent above 260 nm, so that the resolution is not impaired by the longer-wave UV components of commercially available lamps, and performance-reducing and expensive interference filters or appropriately surface-coated reflection mirrors can be omitted.

The method according to the invention is carried out generally as follows:
(a) First, a film of an (uncrosslinked) polymer material with the above-described composition is exposed with a predetermined pattern to short-wave UV rays in the range between about 180 and 260 nm;
(b) The exposure to short-wave UV light is continued until the polymer material is broken down (in the exposed zones) into low-molecular products or into polymers having better dissolution properties; and
(c) The breakdown products in the exposed regions then are removed.

The radiation with short-wave UV light takes place here under oxygen exclusion, preferably in an inert gas or in a vacuum.

The copolymerizate used as the resist material in the method according to the present invention preferably contains 30 to 50 mol % of the ethylenically unsaturated monomer with chlorine and/or cyan substituents. The alkylmethacrylate units of the copolyermizate are, in particular, methylmethacrylate and tert-butylmethacrylate. The units of the ethylenically unsaturated monomer, which is not a methacrylate, are in particular methyl-α-cyanoacrylate, methyl-α-chloroacrylate, α-chloroacrylonitrile and α-chloroacrylic acid. In the method according to the present invention, copolymers of methylmethacrylate and methyl-α-chloroacrylate or methyl-α-cyanoacrylate preferably are used.

From U.S. Pat. No. 4,011,351 it is known that for preparing a positive resist picture by means of electron beams, among other things, a non-crosslinked polymer material with a content of 50 to 99 mol % polymerized alkylmethacrylate units with 1 to 4 C atoms in the alkyl group and 50 to 1 mol % of polymerized units of at least one other ethylenically unsaturated monomer with a halogen and/or cyan substituent can be used. However, it could not be anticipated that polymer materials of this kind also are suitable for exposure by short-wave UV rays in the range of 180 to 260 nm. Thus, it was found surprising that, for example, a copolymerizate with approximately 38 mol % methyl-α-chloroacrylate and 62 mol % methylmethacrylate is about 7 times more sensitive than the heretofore most sensitive polymethylmethyacrylate.

From the fact that the mentioned copolymer also is about 3 to 4 times more sensitive than PMMA to exposure to electrons, under comparable development criteria, it cannot be concluded generally, as will be shown in the following, that all good electron resists are at the same time good resists for exposure to UV rays. Thus, it is known, for example, that a copolymer of methylmethacrylate and methacrylic acid is about 100 times more sensitive as an electron resist than polymethylmethacrylate, but with respect to the sensitivity to short-wave UV rays no difference can be found between the two polymer materials. Hexafluorobutylmethacrylate which likewise is about 100 times more sensitive to exposure by electrons than polymethylmethacrylate, exhibits a sensitivity to shortwave UV rays reduced by a factor of 20.

Even more striking is the behavior of a highly sensitive electron negative resist, used in production for the making of masks, of the polyglycidyl methacrylate type when exposed to short-wave UV rays. This negative resist exhibits not only a UV sensitivity reduced by a factor of 100 in the range of 180 to 260 nm, but it even becomes a positive resist. The resist properties, which are clearly influenced considerably by the type of radiation, indicate distinctly that the possible application of resist materials to the various lithographic processes cannot be predicted and must be ascertained in each individual case.

The copolymers used in the method according to the present invention can be prepared by solution polymerization, using a free radical initiator. The polymerization preferably is performed at temperatures between about 50° and 100° C. where, depending on the other polymerization conditions, polymers with an average numerical molecular weight in the range of about $20 \times 10^3$ to $1000 \times 10^3$ and with an average weight molecular weight in the range of about $40 \times 10^3$ to $2000 \times 10^3$ result.

With the method according to the present invention, the polymer materials are centrifuged in the form of suitable solutions on a substrate by the so-called spin-coating method up to the desired layer thickness of about 50 Å to 10 μm, and preferably of about 0.5 to 2 μm, and are heated (to evaporate the solvent and to eliminate the mechanical stresses in the polymer film) for a predetermined, definite time, preferably not less than 15 minutes and not more than 2 hours, beyond the glass temperature of the polymer, but below its decomposition temperature, preferably in the range between 120° and 170° C.

The increased sensitivity of the polymer materials make them suitable to a particular degree, especially also in conjunction with developers such as methylethyl ketone, for methods for generating structures using short-wave UV rays with commercially available lamps. This results in short exposure times, and the method becomes economically feasible. Due to the exclusive absorptivity for UV rays below 260 nm, in particular the short-wave UV content of the commerical light sources can be utilized without the need to eliminate the long wave emission range by expensive filters which also reduce the useful UV radiation intensity considerably. The co-polymers used in the method according to the present invention are found to be particularly advantageous because, contrary to PMMA, they absorb UV energy also below 220 nm and thus contribute to an increase in sensitivity.

DETAILED DESCRIPTION OF THE INVENTION

The invention is explained in further detail with the aid of an illustrative example and the accompanying FIGURE.

0.208 mol methyl-$\alpha$-chloroacrylate and 0.792 mol methylmethacrylate are dissolved in benzene. To this solution are added 0.5 mMol azoisobutyronitrile and heat is applied under the exclusion of air to about 65° C. for about 8 hours. The polymer obtained is precipitated from the solution with hexane, and subsequently is re-precipitated from chloroform/hexane. After drying in a vacuum (at a pressure of less than 13 Pa) at room temperature, 26 g of polymer are obtained, the viscosity number of which is about 50 ml/g, as measured in butanone at 20° C. The composition was determined on the basis of the chlorine content and gave a content of 38 mol % methyl-$\alpha$-chloroacrylate and 62 mol % methylmethacrylate.

With a 7.5% solution of the polymer in chlorobenzene, a transparent film about 0.6 $\mu$m thick is prepared on a silicon wafer with a silicon dioxide surface by spinning at about 4000 rpm. After drying the film for about 45 minutes at about 170° C., the resist material, which is partly covered up by a slot mask, is irradiated with a low-pressure mercury lamp for different periods of time. The film then is developed at 20° C. in a developer mixture of methylethyl ketone and ethanol for 2 minutes, rinsed and then post-dried for 30 minutes at about 120° C. The exposed zones are dissolved-out by the developer, according to the doses, to different degrees, so that a contrast curve is obtained directly. The actual thickness which remains in the non-irradiated zone is about 97 to 100% of the original film thickness.

In order to demonstrate experimentally the real sensitivity increase which can be obtained with the method according to the present invention as compared to polymethylmethacrylate, a PMMA film was prepared under comparable conditions, irradiated and developed with a likewise negligible dark loss.

The result of the comparison experiments can be seen in the FIGURE where the sensitivity curves are shown; the exposure time t in minutes is plotted on the abscissa and the normalized layer thickness $d/d_0$ on the ordinate. It is seen from the FIGURE that the sensitivity can be increased by a factor of 7 with the method according to the present invention (curve A) as compared to PMMA (curve B).

What is claimed is:

1. In a method for the manufacture of resist structures on the basis of positive resists wherein a polymer material in the form of a layer or film is exposed with a predetermined pattern to short-wave UV rays and the exposed portions of the layer or film thereafter removed, the improvement wherein the polymer material comprises a copolymer of:
   (a) 1 to 70 mol percent alkylmethacrylate with an alkyl radical having 1 to 4 C atoms; and
   (b) 30 to 99 mol percent of an ethylenically unsaturated monomer having chlorine and/or cyan substituents.

2. The method according to claim 1 wherein said polymer material is a copolymer of methylmethacrylate and methyl-$\alpha$-chloroacrylate.

3. The method according to claim 1 wherein said polymer material is a copolymer of methylmethacrylate and methyl-$\alpha$-cyanoacrylate.

* * * * *

UNITED STATES PATENT AND TRADEMARK OFFICE
CERTIFICATE OF CORRECTION

PATENT NO. : 4,395,481

DATED : July 26, 1983

INVENTOR(S) : Siegfried Birkle, Roland Rubner, Hans Hauschildt, Eva-Maria Rissel It is certified that error appears in the above-identified patent and that said Letters Patent is hereby corrected as shown below:

The title page should be deleted to appear as per attached title page.

Signed and Sealed this

Nineteenth Day of March 1985

[SEAL]

Attest:

DONALD J. QUIGG

Attesting Officer   Acting Commissioner of Patents and Trademarks

United States Patent [19]

Birkle et al.

[11] 4,395,481

[45] Jul. 26, 1983

[54] METHOD FOR THE MANUFACTURE OF RESIST STRUCTURES

[75] Inventors: Siegfried Birkle, Höchstadt; Roland Rubner, Röttenbach; Hans Hauschildt, Erlangen; Eva-Maria Rissel, Forchheim, all of Fed. Rep. of Germany

[73] Assignee: Siemens Aktiengesellschaft, Munich, Fed. Rep. of Germany

[21] Appl. No.: 305,798

[22] Filed: Sep. 25, 1981

[30] Foreign Application Priority Data

Sep. 29, 1980 [DE] Fed. Rep. of Germany ....... 3036615

[51] Int. Cl.$^3$ .................................................. G03C 5/00
[52] U.S. Cl. .......................................... 430/326; 430/5
[58] Field of Search ............... 430/326, 313, 314, 315, 430/296, 5, 306, 908, 285

[56] References Cited

U.S. PATENT DOCUMENTS

| | | | |
|---|---|---|---|
| 4,011,351 | 3/1977 | Gipstein et al. | 430/296 |
| 4,268,607 | 5/1981 | Tada | 430/296 |
| 4,273,856 | 6/1981 | Yoneda et al. | 430/326 |

FOREIGN PATENT DOCUMENTS

| | | | |
|---|---|---|---|
| 54-41207 | 12/1979 | Japan | 430/326 |
| 55-140836 | 11/1980 | Japan | 430/326 |

*Primary Examiner*—Won H. Louie, Jr.
*Attorney, Agent, or Firm*—Kenyon & Kenyon

[57] ABSTRACT

The invention relates to a method for the manufacture of positive resist structures by means of short-wave UV rays and has the objective to develop such a method in a manner such that increased sensitivity and resolution as well as high thermal stability and, in addition, transparency in the wave-length range above 260 nm can be achieved. According to the invention, it is provided for this purpose to use as the resist material copolymers of 1 to 70 mol % alkylmethacrylate with an alkyl radical having 1 to 4 C atoms, and 99 to 30 mol % of an ethylenically unsaturated monomer with chlorine and/or cyan substituents. The method according to the invention is particularly well suited for producing resist structures about 0.5 to 2 μm thick by means of UV rays in the wave-length range between about 180 to 260 nm.

3 Claims, 1 Drawing Figure